(12) United States Patent
Tsuno

(10) Patent No.: US 6,323,485 B1
(45) Date of Patent: Nov. 27, 2001

(54) ELECTRON MICROSCOPE EQUIPPED WITH ENERGY FILTER

(75) Inventor: Katsushige Tsuno, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/289,486

(22) Filed: Apr. 9, 1999

(30) Foreign Application Priority Data

Apr. 10, 1998 (JP) .................................................. 10-099321

(51) Int. Cl.⁷ ....................................................... H01J 49/46
(52) U.S. Cl. ........................................... 250/311; 250/305
(58) Field of Search ................................... 250/311, 310, 250/305, 396 R, 396 ML

(56) References Cited

U.S. PATENT DOCUMENTS

| | | | |
|---|---|---|---|
| 4,812,652 | 3/1989 | Egle et al. ............................ | 250/311 |
| 5,798,524 | * 8/1998 | Kundmann et al. .................. | 250/305 |
| 6,097,028 | * 8/2000 | Tsuno ................................... | 250/305 |
| 6,140,645 | * 10/2000 | Tsuno ................................... | 250/311 |
| 6,150,657 | * 11/2000 | Kimoto et al. ....................... | 250/305 |

OTHER PUBLICATIONS

Ultramicroscopy Letter "Acceptance of imaging energy filters", Stephen Uhlemann and Harold Rose,*Ultramicroscopy*, 63 (1996) pp. 161–167.

* cited by examiner

*Primary Examiner*—Kiet T. Nguyen
(74) *Attorney, Agent, or Firm*—Webb Ziesenheim Logsdon Orkin & Hanson, P.C.

(57) ABSTRACT

There is disclosed an electron microscope equipped with an Ω-filter and having an improved energy resolution. An objective lens and an intermediate lens system are mounted upstream of the filter. A projector lens system is mounted downstream of the filter. When a total magnification is entered from an input device, a controller sets the magnification of the projector lens system and the magnification of the lens system upstream of the filter so as to make the energy resolution highest. The exciting portion of the microscope is excited accordingly. Exciting currents for accomplishing a desired magnification are supplied from the exciting portion to the lenses. This optimizes the magnification of the projector lens system and the magnification of the lens system upstream of the Ω-filter, thus achieving higher-energy resolution.

18 Claims, 4 Drawing Sheets

ELECTRON MICROSCOPE EQUIPPED WITH ENERGY FILTER

FIELD OF THE INVENTION

The present invention relates to an electron microscope equipped with an Ω-filter and, more particularly, to an electron microscope equipped with an energy filter capable of providing a high-energy resolution.

DESCRIPTION OF THE PRIOR ART

In recent years, instruments comprising a transmission electron microscope having an imaging lens system in which an energy filter is mounted have enjoyed wide acceptance. An instrument of this kind is known as an apparatus equipped with an electron spectroscopic imaging (ESI) system. Various types of energy filters are available. An instrument using an Ω-filter or an α-filter is ordinarily known as an in-column energy filter, since the optical axis of the beam incident on the energy filter is in line with the optical axis of the beam going out of the filter.

FIG. 6 schematically shows an in-column ESI system using an Ω-filter. This system comprises an objective lens 1, an objective aperture 3, intermediate lenses 5, 6, 7, the Ω-filter 8, an exit slit 10, projector lenses 11, 12, and an image-recording system 14. The Ω-filter 8 has an entrance window 9.

An electron beam emitted from an electron gun (not shown) is converged by a condenser lens (not shown) and focused onto the specimen 4 by the objective lens 1. A diffraction pattern of the specimen 4 is created at the position of the back focal plane of the objective lens 1 downstream of the specimen 4 (i.e., on the side of the image-recording system 14). Also, an electron microscope image (hereinafter referred to as EM image) of the specimen is created at a given position. The objective aperture 3 is located at the position of the back focal plane of the objective lens 1.

The electron beam transmitted through the objective aperture 3 is converged by the action of the intermediate lenses 5, 6, and 7 and enters the Ω-filter 8 from its entrance window 9. Only those electrons of the electron beam which have a certain energy are allowed to go out of the exit slit 10 that is located at the position of the exit window of the Ω-filter 8.

With the structure shown in FIG. 6, an EM image attributed to an electron beam having a certain range of energies passed through the Ω-filter 8 can be created. Furthermore, it is possible to obtain a diffraction pattern owing to the electron beam having the certain range of energies passed through the Ω-filter 8. In either case, an EM image and a diffraction pattern are required to be formed at given positions in the Ω-filter 8. In particular, in the former case (to obtain an EM image on the image-recording system 14), the diffraction pattern needs to be created in the position of the entrance window 9 of the Ω-filter 8, and the EM image needs to be formed at the position A of the entrance pupil inside the Ω-filter 8. In the latter case (to obtain a diffraction pattern on the image-recording system 14), the EM image needs to be created in the position of the entrance window 9 of the Ω-filter 8, while the diffraction pattern needs to be formed at the position A of the entrance pupil of the Ω-filter 8.

Namely, the EM image and the diffraction pattern are focused at different positions, depending on whether the EM image or the diffraction pattern is observed. To focus the diffraction pattern or the EM image at the position of the entrance window 9, three stages of intermediate lenses 5, 6, and 7 are mounted. When an EM image should be observed, these lenses 5–7 are excited to bring the diffraction pattern formed in the back focal plane of the objective lens 1 into focus at the position of the entrance window 9 and to bring the EM image into focus at the position A of the entrance pupil inside the Ω-filter 8. When the diffraction pattern is observed, the lenses 5–7 are so excited that the diffraction pattern created in the back focal plane of the objective lens 1 is brought into focus at the position A of the entrance pupil inside the Ω-filter 8 and that the EM image is brought into focus at the position of the entrance window 9.

When an EM image is observed, the diffraction pattern formed at the position of the entrance window 9 is brought into focus at the position of the exit slit 10 by the action of the Ω-filter 8, the exit slit 10 being positioned immediately behind the exit port of the Ω-filter 8. The EM image created at the position A of the entrance pupil is brought into focus at the position of the exit pupil B by the action of the Ω-filter 8. The position of the entrance pupil A and the position of the exit pupil B are symmetrical with respect to the center O of the Ω-filter 8. Similarly, the entrance window 9 and the exit slit 10 are arranged symmetrically with respect to the center O of the Ω-filter 8.

The EM image or diffraction pattern focused at the position B of the exit pupil in the Ω-filter 8 is magnified and focused onto the image-recording system 14 by the projector lenses 11 and 12. In this way, the first stage of projector lens 11 takes an image at the position of the exit pupil B of the Ω-filter 8 as an object plane. In this instrument, film, an imaging plate, a TV camera consisting of a CCD camera or the like is used as the image-recording system 14.

Usually, the Ω-filter 8 is composed of plural magnets. Since the shapes of the individual magnets and their arrangement per se are not essential to the present invention, the individual magnets of Ω-filter 8 are omitted in FIG. 6. The intermediate lenses 5, 6, and 7 will hereinafter be referred to as the intermediate lens system. Also, the projector lenses 11 and 12 will hereinafter be referred to as the projector lens system.

In the electron microscope equipped with the energy filter as shown in FIG. 6, all the lenses have variable magnifications. In the past, when a certain magnification is set, the magnification $M_{PL}$ of the projector lens system is made fixed, and the combination of exciting currents to the lenses is so set that the necessary magnification range is covered by the total magnification $M_i$ of the lenses located upstream (i.e., on the side of the electron gun) of the Ω-filter 8, as described in U.S. Pat. No. 4,812,652. Where the kind, position, or size of the image-recording system 14 is modified, the magnification $M_{PL}$ of the projector lens system is varied simply to provide a desired magnification.

Usually, the fixed magnification $M_{PL}$ of the projector lens system is set to a range of approximately 20 to 100×. Specifically, where film or an imaging plate is used as the image-recording system 14, the magnification is set to about 100×. Where a TV camera is employed as the image-recording system 14, the magnification is set to about 25×. In this way, the magnification of the projector lens system is varied according to the kind of the image-recording system 14, because the image is recorded in a different area, depending on a different kind of image-recording system.

Let $M_{OL}$ be the magnification of the objective lens 1. Let $M_{IL}$ be the magnification of the intermediate lens system. Obviously, the total magnification of the lenses located upstream of the Ω-filter 8 is given by $$M_t = M_{OL} * M_{IL}$$

We have discovered, however, that high-energy resolutions cannot be obtained if the magnification $M_{PL}$ of the projector lens system is fixed at a value within a range of 20 to 100× as in the prior art technique.

SUMMARY OF THE INVENTION

Accordingly, it is an object of the present invention to provide an electron microscope which is equipped with an energy filter and which can provide higher-energy resolution without modifying the energy filter at all by optimally setting the magnification of the projector lens system.

The above-described object is achieved by an electron microscope in accordance with this invention, the electron microscope being equipped with an energy filter and having lens systems upstream and downstream of the energy filter, respectively. This microscope is characterized in that when the total magnification is changed, the magnification of the lens system upstream of the energy filter and the magnification of the lens system downstream of the energy filter are both varied.

An electron microscope in accordance with a preferred embodiment of this invention is further characterized in that the ratio of the magnification of the lens system upstream of the energy filter to the total magnification is increased with increasing the total magnification.

An electron microscope in accordance with a preferred embodiment of this invention is further characterized in that the diameter of the objective aperture is modified according to the total magnification.

An electron microscope in accordance with a preferred embodiment of this invention has energy filter and lens systems upstream and downstream of the energy filter, respectively, and is characterized in that the magnification of the lens system downstream of the energy filter is in excess of 100× where film or an imaging plate is used as the image-recording system.

An electron microscope in accordance with a preferred embodiment of this invention has energy filter and lens systems upstream and downstream of the energy filter, respectively, and is characterized in that the magnification of the lens system downstream of the energy filter is in excess of 25× where a TV camera is used as the image-recording system.

Other objects and features of the invention will appear in the course of the description thereof, which follows.

DESCRIPTION OF THE PREFERRED EMBODIMENTS

Figure 6:
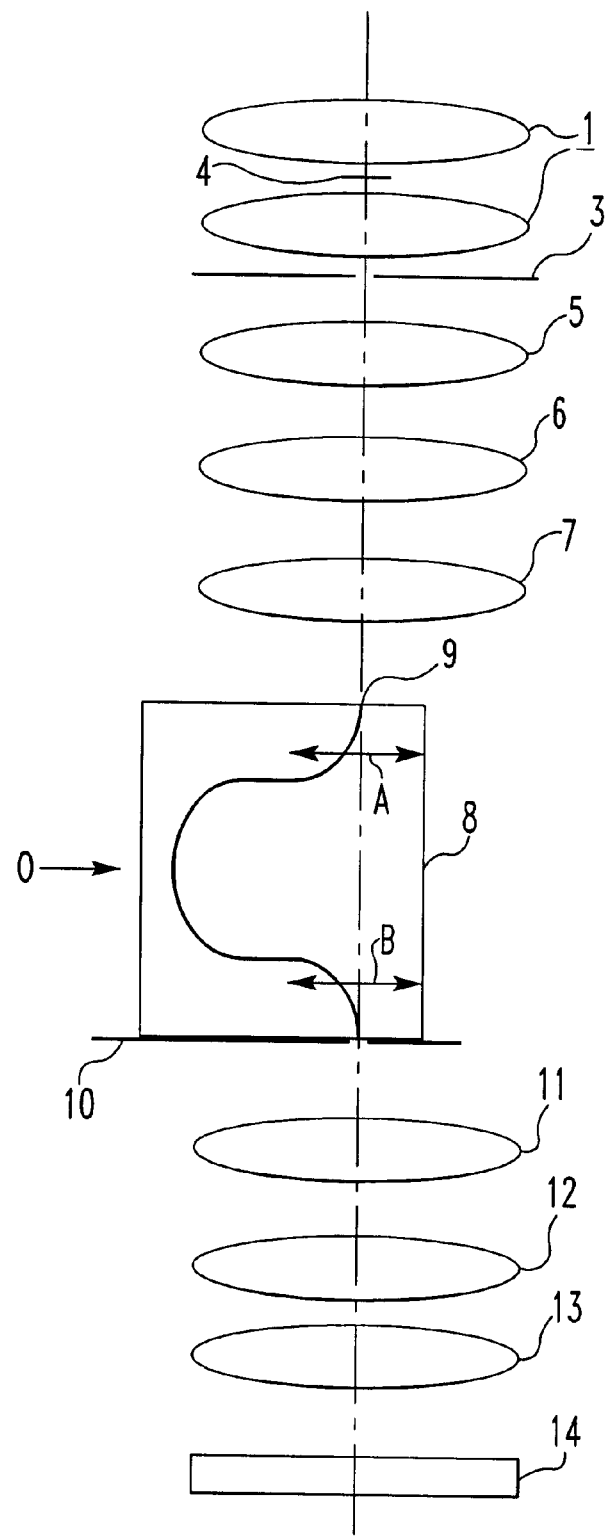
FIG. 6 is a diagram of an in-column ESI instrument equipped with an Ω-filter.

The preferred embodiments of the present invention are hereinafter described by referring to the drawings. Energy resolution is expressed in an electron microscope fitted with an energy filter in the manner described below. This microscope has the same optics as shown in FIG. 6.

An energy resolution is a range of energies of an electron beam entering the exit slit 10 having a width of s, the slit being used for selection of energies. For example, where the energy resolution is 10 eV, an image is created only from an electron beam having no energy-loss electrons (i.e., whose energy losses are not in excess of 10 eV compared with zero-loss electrons). For instance, energy-loss electrons of 5 eV are allowed to exist in some region within an image. However, it is undesirable that electrons having energy losses of 11 eV exist near edges rather than the center of the image. This is known as non-isochromaticity. Any electron microscope fitted with an energy filter suffers from such non-isochromaticity, though the extent may not be uniform among different instruments.

Where such non-isochromaticity does not occur, the width s of the exit slit 10 is given by the product of the energy resolution ΔE and the energy dispersion D of the Ω-filter 8. It is assumed that the filter 8 has no aberration and that the exit slit 10 has a width of s(ideal). We have $$s(ideal) = \Delta E \cdot D = 2\alpha_0 \cdot L_L \cdot M_P / M_t \tag{1}$$

where $2\alpha_0$ is the divergence angle of the electron beam in leaving the specimen 4, $L_L$ is the distance between the plane of the entrance window 9 of the Ω-filter 8 and the plane of the entrance pupil A, $M_t$ is the total magnification of the electron microscope, and $M_P$ is the magnification of the lens system downstream of the Ω-filter 8. Also, the relation holds:

$$r_W = \alpha_0 \cdot L_L / M_i \tag{2}$$

where $r_W$ is the size of the electron beam on the plane of the entrance window 9 of the Ω-filter 8, and $M_i$ is the magnification of the lens system upstream of the Ω-filter 8 including the objective lens 1 and the intermediate lenses 5–7. The total magnification is given by $$M_t = M_i \cdot M_P \tag{3}$$

In the description provided thus far, it has been assumed that the Ω-filter 8 has no aberration. In practice, it has aberration, which increases the size of the electron beam on the plane of the exit slit 10 or distorts it into a triangular form (i.e., a blurring takes place). Therefore, the width of the exit slit 10 must be set, taking account of the blurring of the electron beam due to the aberration of the Ω-filter 8.

The blurring of the electron beam on the plane of the exit slit 10 due to the aberration of the Ω-filter 8 is approximated as follows:

$$\Delta X = (r_p / L_L)^2 \cdot (A_{\gamma\gamma\gamma} + B_{\gamma\delta\delta} / 2) \tag{4}$$

where $r_p$ is the size of the image on the plane of the exit pupil B, and $A_{\gamma\gamma\gamma}$ and $B_{\gamma\delta\delta}$ are principal second-order aberration coefficients determining the aberration of the Ω-filter 8.

Since the magnification of the Ω-filter 8 is 1×, aberration determined by Eq. (4) adds to the diameter of the incident beam projected onto the plane of the exit slit 10 at a magnification of 1× by the Ω-filter 8. This blurring ΔX occurs everywhere on the diameter of the beam incident on the Ω-filter 8. If the diameter of the incident beam is added to the blurring on the lowest-energy side, the size of the blurred beam can be approximated. Accordingly, let s(real) be the width of the exit slit 10 when the aberration of the Ω-filter 8 is taken into consideration. Thus, $$s(real) = 2\alpha_0 \cdot L_L \cdot M_p/M_t + (r_f^2/L_L \cdot M_p) \cdot (A_{\gamma\gamma\gamma} + B_{\gamma\delta\delta}/2) \quad (5)$$

where $r_f$ is the radius of the electron beam on the image-recording system 14.

In practice, however, s(real) given by Eq. (5) does not take account of the density distribution of the electron beam. Usually, resolution is the ability to separate two peaks. In this sense, the width of the exit slit 10 can be less than the s(real) given by Eq. (5). What is given by Eq. (5) is a resolution defined as the width of energy of the electron beam entering within a range of the width s of the exit slit 10. Therefore, it can be converted into a half-value resolution (at which two peaks can be simply separated as described above) by approximating the s (real) by 60–70% of s(real).

The energy resolution ΔE can be found by dividing s(real) by energy dispersion D. Thus, $$\Delta E = s(real)/D \quad (6)$$

In this case, an EM image of the specimen is projected onto the image-recording system 14. Where a diffraction pattern is created, a different situation takes place. That is, an EM image is focused onto the plane of the entrance window 9 of the Ω-filter 8 where an observable diffraction pattern is created, as mentioned previously. Let $r_0$ be the radius of the electron beam on the specimen 4. Let $r_e$ be the blurring of the electron beam due to the aberrations of the objective lens 1 and the intermediate lens system. The blurring is given by $$r_e = (M_{IL}/4) \cdot (C_{SIL} \cdot \alpha_i^3 + M_{OL} \cdot C_s \alpha_{03}) \quad (7)$$

where $\alpha_i$ is the divergence angle of the electron beam in leaving the intermediate lens system and given by $$\alpha_i = \alpha_0/M_{OL} \quad (8)$$

In the above equation, $M_{IL}$ is the magnification of the intermediate lens system, $M_{OL}$ is the magnification of the objective lens 1, $C_{SIL}$ is the spherical aberration of the intermediate lens system, and $C_s$ is the spherical aberration of the objective lens 1.

Assuming that the electron beam has a radius $r_w$ (diff) on the plane of the entrance window 9 of the Ω-filter 8 when a diffraction pattern is observed, we have $$r_w(diff) = ((r_0 \cdot M_{OL} \cdot M_{IL})^2 + r_e^2)^{1/2} \quad (9)$$

Figure 1:
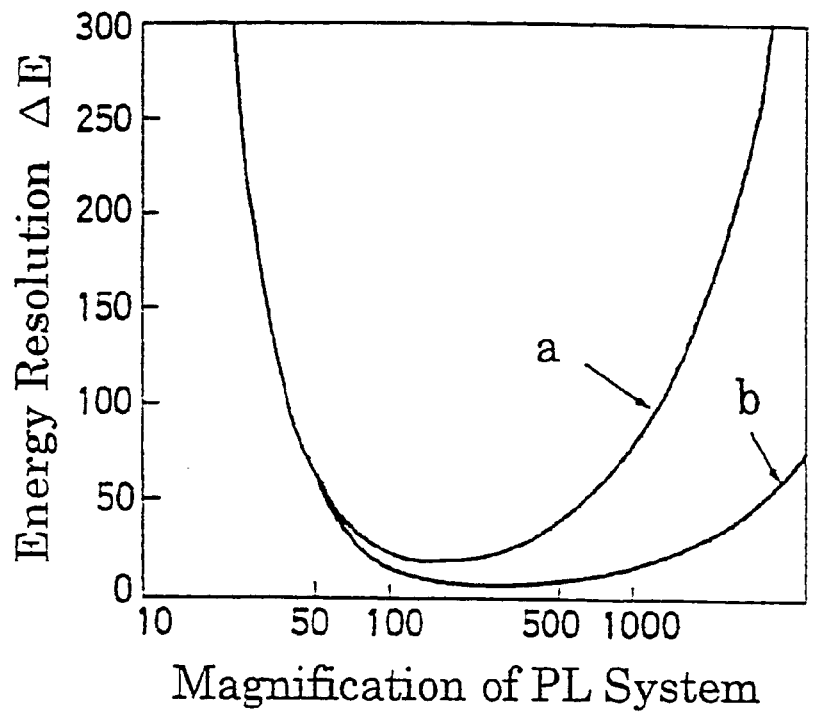
FIG. 1 is a diagram in which the energy resolution ΔE of an instrument equipped with an Ω-filter is plotted against the magnification of the projector lens system where an EM image is observed.

Because the contribution from the aberration of the Ω-filter 8 does not differ in extent from the case where a magnified image is observed, the energy resolution ΔE(diff) when a diffraction pattern is observed is given by $$\Delta E(diff) = s(real - diff)/D \quad (10)$$

$$= (r_w(diff) + \Delta X)/D$$

$$= [\{r_0 \cdot M_{OL} \cdot M_{IL}\}^2 + ((M_{IL}/4) \cdot$$

$$(C_{SIL} \cdot \alpha_i^3 + M_{OL} \cdot C_s \alpha_0^3))^2\}^{1/2} +$$

$$(r_f/L_L)^2 \cdot (A_{\gamma\gamma\gamma} + B_{\gamma\delta\delta}/2)/D]$$

where s(real-diff) is the width of the exit slit 10.

Where a magnified image is observed using some Ω-filter, if the magnification of the projector lens system is varied, the energy resolution will change. This change is calculated using the formula described above. As a result, a graph as shown in FIG. 1 is obtained. Curve a of FIG. 1 indicates a case in which $\alpha_0 = 10$ mrad. Curve b indicates a case in which $\alpha_0 = 2$ mrad. In these cases, the total magnification $M_t$ is kept constant. Accordingly, in deriving the graph of FIG. 1, the magnification of the lens system upstream of the Ω-filter 8 is varied according to variations in the magnification of the projector lens system so that the total magnification is kept constant.

It can be seen from FIG. 1 that the energy resolution ΔE cannot be optimized if the magnification of the projector lens system is fixed at a value within the range of 20 to 100×, and that the energy resolution can be improved by making the magnification of the projector lens system higher. Furthermore, it can be observed that increasing the magnification of the projector lens system greatly will deteriorate the energy resolution. Hence, the magnification of the projector lens system has an optimum value.

Accordingly, the present invention is intended to provide higher energy resolution by optimizing the magnification of the projector lens system. It can be seen from FIG. 1 that the magnification of the projector lens system has an optimum value within a range of 100 to 500×, whether $\alpha_0$ is 10 mrad or 2 mrad, and thus an improved energy resolution can be obtained. If the total magnification is varied, the relation will depart from the graph showing the relation between the magnification of the projector lens system and the energy resolution. In the case shown in FIG. 1, film or an imaging plate is used as the image-recording system 14. Where a TV camera is used as the image-recording system 14, the recording area is reduced to about ¹⁄₁₆. Therefore, the optimum magnification of the projector lens system can be reduced to ¼ compared with the case in which film or imaging plate is used as the image-recording system 14. Consequently, where a TV camera is used as the image-recording system 14, an optimum value exists where the magnification of the projector lens is within a range of 25 to 125×. Even in the above-described case, if the total magnification is lower than the optimum magnification of the projector lens system, the magnification of the intermediate lens system is set less than 1.

Figure 2:
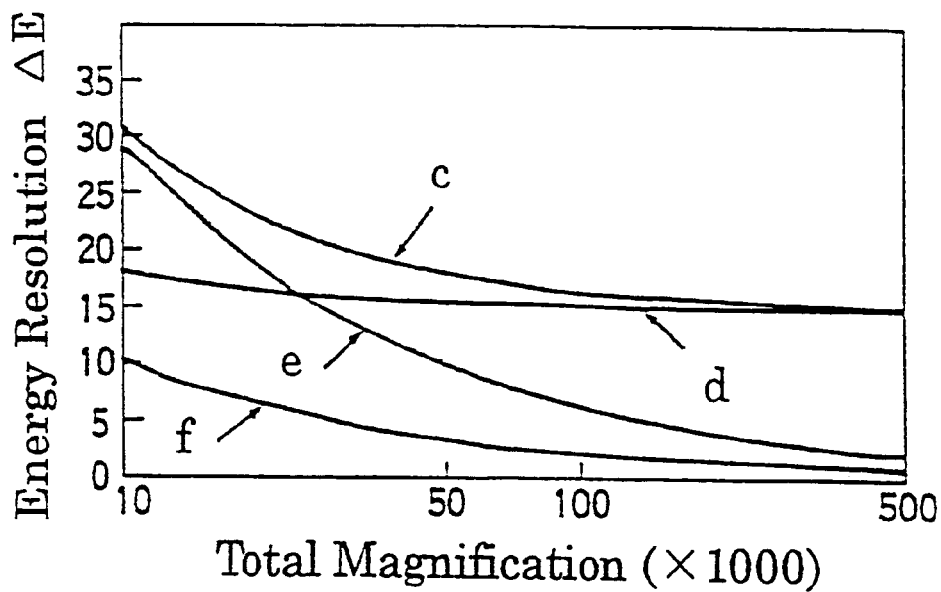
FIG. 2 is a diagram in which the energy resolution ΔE is plotted against the total magnification where the magnification of the projector lens system is set to 100×, and in which the energy resolution ΔE is plotted against the total magnification where the magnification of the projector lens system is so set as to minimize the energy resolution ΔE.

Curves c and d of FIG. 2 were obtained by using the same Ω-filter as used to obtain the graph of FIG. 1 and plotting the energy resolution ΔE against the total magnification at a projector lens system magnification of 100×. The curves c and d were obtained where $\alpha_0 = 10$ mrad and $\alpha_0 = 2$ mrad, respectively. The scale factor of the horizontal axis of FIG. 2 is ¹⁄₁₀₀₀. Therefore, "100" on the horizontal axis of FIG. 2 indicates 100,000×.

On the other hand, curves e and f of FIG. 2 were obtained by plotting the energy resolution ΔE against the total magnification where the magnification of the projector lens system is so set as to minimize the value of the energy resolution ΔE in the graph of FIG. 1 (i.e., the energy resolution ΔE is highest). The curves e and f were obtained where $\alpha_0$=10 mrad and $\alpha_0$=2 mrad, respectively.

It can be seen from FIG. 2 that the energy resolution can be made higher than conventional by optimizing the magnification of the projector lens system, whether $\alpha_0$ is 10 mrad or 2 mrad. Of course, it is important to improve the characteristics of the energy filter itself in enhancing the energy resolution of an electron microscope equipped with an energy filter. It is also very important to optimize the magnification of the projector lens system.

Where it is desired to obtain a certain energy resolution irrespective of variations in the magnification, the divergence angle $\alpha_0$ of the electron beam leaving the specimen 4 should be lowered with reducing the magnification. This is quite advantageous in practical applications, for the following reason. In high-resolution applications using a large divergence angle, the total magnification is set to a large value of more than 500,000×. On the other hand, in almost all low-magnification applications, high image contrast is necessary and so it is customary to use small objective apertures such that an observation is made at small divergence angles.

Figure 3:
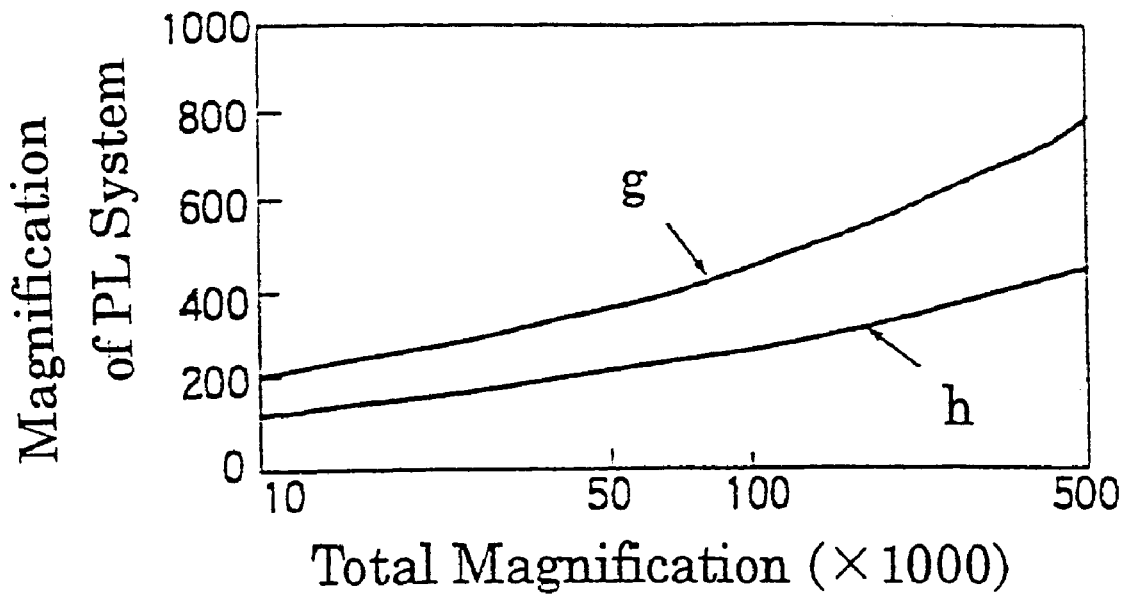
FIG. 3 is a diagram in which the magnification of the projector lens system is plotted against the total magnification, illustrating a magnification of the projector lens system that gives a minimum energy resolution ΔE.

FIG. 3 was obtained by plotting the magnification of the projector lens system of the instrument using the same Ω-filter as used in obtaining the graph of FIG. 1 against the total magnification where the magnification of the projector lens system minimizing the energy resolution ΔE is found using the equation described above. Curves g and h were obtained where $\alpha_0$=2 mrad and $\alpha_0$=10 mrad, respectively. It can be seen from this graph that it is necessary to increase the magnification of the projector lens system as the total magnification is increased. In FIG. 3, too, the scale factor of the horizontal axis of FIG. 3 is 1/1000.

Figure 4:
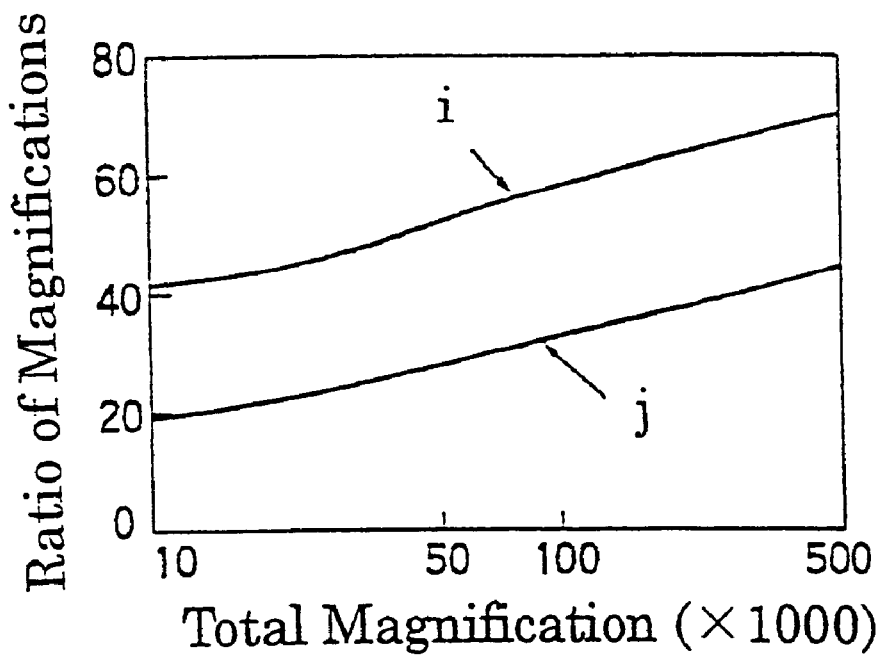
FIG. 4 is a diagram in which the ratio of the magnification of the lens system upstream of an Ω-filter 8 is plotted against the total magnification.

FIG. 4 is a graph illustrating the ratio of the magnification of the lens system upstream of the Ω-filter 8 to the total magnification. Curves i and j were obtained where $\alpha_0$=10 mrad and $\alpha_0$=2 mrad, respectively. It can be seen from the graph of FIG. 4 that it is necessary to increase the magnification of the lens system upstream of the Ω-filter 8 as the divergence angle $\alpha_0$ of the electron beam is increased. It is thought that as the magnification of the lens system upstream of the Ω-filter 8 is increased, the diameter $r_w$ of the electron beam on the plane of the entrance window 9 of the filter 8 is reduced, thus improving the energy resolution ΔE. In FIG. 4, too, the scale factor of the horizontal axis of FIG. 4 is 1/1000.

In above-described mode of operation, an EM image is observed. It has been confirmed that similar conclusions can be derived from the formulas described above where diffraction pattern images are observed.

Figure 5:
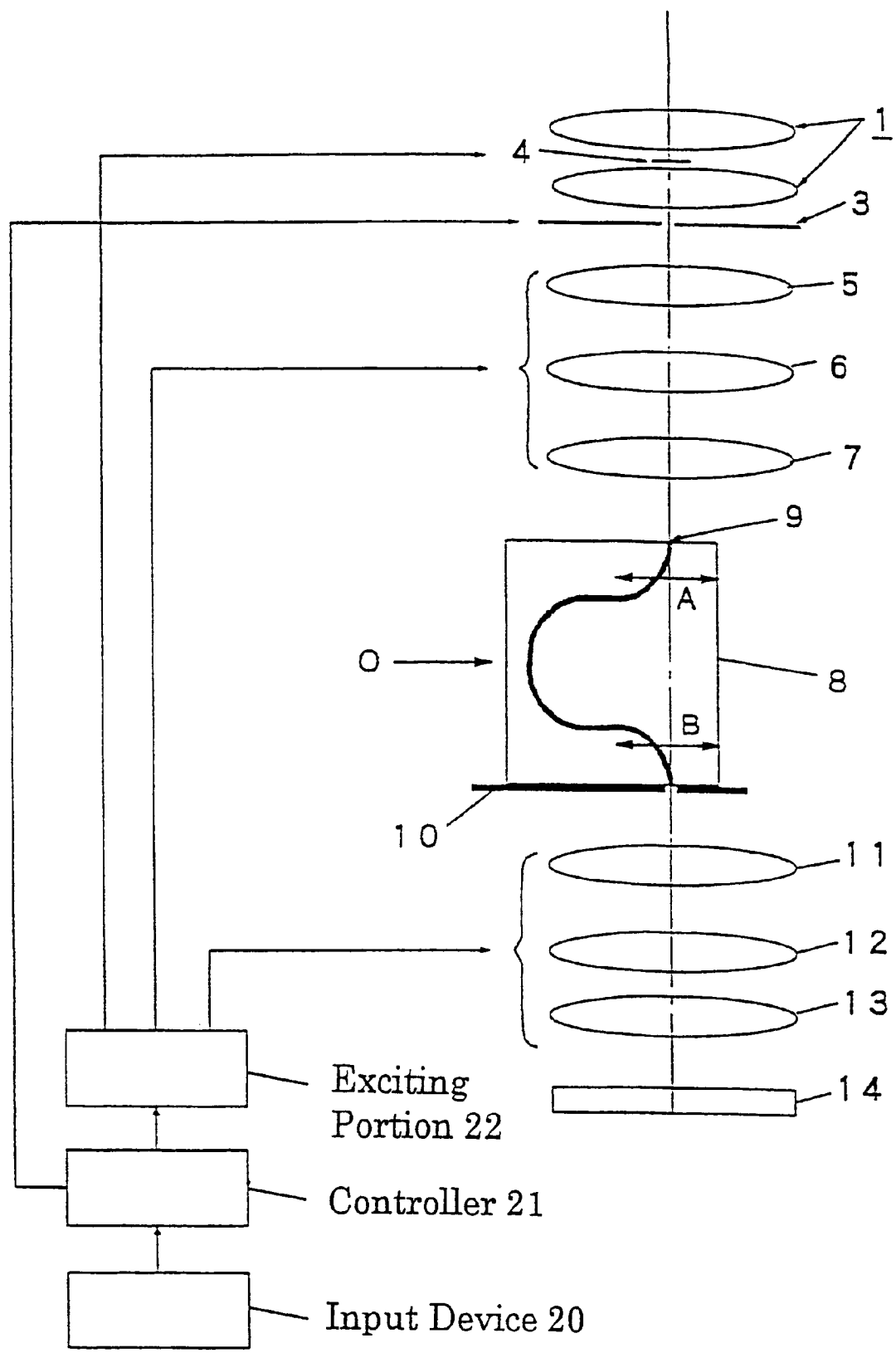
FIG. 5 is a diagram of an electron microscope equipped with an energy filter in accordance with the present invention.

FIG. 5 shows an electron microscope having an energy filter in accordance with one embodiment of the present invention. This instrument shown in FIG. 5 is similar to the instrument shown in FIG. 6 except that another projector lens 13, an input device 20, a controller 21, and an exciting portion 22 are added.

The projector lens system of this electron microscope has three stages of projector lenses 11, 12, and 13. As mentioned previously, it is necessary to vary the magnification of the projector lens in order to obtain a high-energy resolution. For this purpose, three or more stages of lenses are generally necessary. The objective aperture 3 is provided with plural holes of different diameters.

The input device 20 is used to enter various parameters in observing images, and comprises a keyboard. The entered parameters include a signal for selecting between the image mode and the diffraction mode, the kind of Ω-filter used, the divergence angle $\alpha_0$ of the electron beam, the total magnification in the image mode, and the kind of image-recording system 14.

The controller 21 has tables used to set the optimum magnification of the projector lens system and the magnification of the lens system upstream of the Ω-filter 8 according to the parameters entered from the input device 20. This table is prepared as follows. First, used Ω-filters are prepared. Some divergence angles $\alpha_0$ of each of the filters are found for each kind of image-recording system used. Then graphs, as shown in FIGS. 3 and 4, are found for these divergence angles $\alpha_0$. These graphs are registered as tables. Therefore, if parameters are entered from the input device 20, the controller 21 finds a referenced magnification-setting table, depending on the kind of image-recording system used and on the Ω-filter used. Based on this magnification-setting table, the controller 21 determines the entered divergence angle $\alpha_0$, the magnification of the projector lens system, and the magnification of the lens system upstream of the Ω-filter at some total magnification, and informs the exciting portion 22 of these parameters.

On receiving signals indicating the magnification of the projector lens system and the magnification of the lens system upstream of the Ω-filter from the controller 21, the exciting portion 22 distributes the magnification of the projector lens system among the projector lenses 11, 12, and 13 and sets the magnifications of these projector lenses 11–13. The exciting portion 22 further distributes the magnification of the lens system upstream of the Ω-filter among the objective lens 1 and the intermediate lenses 5, 6, and 7 and creates exciting currents to these lenses, producing the distributed magnifications of the lenses. The manner in which the magnifications are distributed among the projector lenses may be appropriately set. For example, when the magnification of the projector lens system is set, exciting currents to be supplied to the projector lenses 11–13 are preset, and a table is created from them. This table is registered in the exciting portion 22. Exciting currents to be supplied to the lenses upstream of the Ω-filter may be similarly set.

The controller 21 sets the diameter of the objective aperture 3 according to the total magnification entered from the input device 20. The controller 21 causes a driving means (not shown) to drive the objective aperture 3 to bring the set diameter into the position of the optical axis. As can be understood from the description previously made in connection with FIG. 2, it is necessary to increase the diameter of the objective aperture as the total magnification is increased.

Since the control mechanism is designed in this way, the magnification of the projector lens system and the magnification of the lens system upstream of the Ω-filter are optimized. Thus, high-energy resolution can be accomplished.

While one preferred embodiment of the present invention has been described thus far, the present invention is not limited thereto. Rather, various changes and modifications are possible. For example, the number of intermediate lenses is not limited to three. Any number may be selected, as long as it is one or more and the magnification $M_{IL}$ of the intermediate lens system can be realized. Similarly, the number of projector lenses is not restricted to three. Any number may be selected, as long as it is one or more and the magnification $M_P$ of the projector lens system can be realized.

In the description provided above, an Ω-filter is used. The invention can also be applied to an instrument using other energy filters.

Having thus described my invention with the detail and particularity required by the Patent Laws, what is desired protected by Letters Patent is set forth in the following claims.

What is claimed is:

1. An electron microscope equipped with an energy filter and exhibiting a total magnification, said electron microscope comprising:
   an upstream lens system mounted upstream of said energy filter and exhibiting a magnification;
   a downstream lens system mounted downstream of said energy filter and exhibiting a magnification; and
   means for varying both magnifications of the upstream and downstream lens systems when the total magnification of the electron microscope is varied.

2. The electron microscope of claim 1, wherein the ratio of the magnification of said upstream lens system to the total magnification is increased with increasing the total magnification.

3. The electron microscope of claim 2, wherein there is further provided an objective aperture having a diameter, and wherein the diameter of said objective aperture is modified according to the total magnification.

4. The electron microscope of claim 6, wherein the magnifications of the upstream and downstream lens systems and the diameter of said objective aperture are automatically varied when the total magnification is varied.

5. The electron microscope of claim 1 or 2, wherein the magnifications of the upstream and downstream lens systems are automatically varied when the total magnification is varied.

6. The electron microscope of claim 1, wherein there is further provided an objective aperture having a diameter, and wherein the diameter of said objective aperture is modified according to the total magnification.

7. An electron microscope equipped with an energy filter and exhibiting a total magnification, said electron microscope comprising:
   an upstream lens system mounted upstream of said energy filter and exhibiting a magnification;
   a downstream lens system mounted downstream of said energy filter and exhibiting a magnification of more than 100 times the image formed by the upstream lens system; and
   an image-recording system made of film or an imaging plate,
   wherein the magnifications of said upstream and downstream lens systems are both varied when the total magnification is varied.

8. The electron microscope of claim 7, wherein the ratio of the magnification of said upstream lens system to the total magnification is increased with increasing the total magnification.

9. The electron microscope of claim 8, wherein there is further provided an objective aperture having a diameter, and wherein the diameter of said objective aperture is modified according to the total magnification.

10. The electron microscope of claim 9 wherein the magnifications of the upstream and downstream lens systems and the diameter of said objective aperture are automatically varied when the total magnification is varied.

11. The electron microscope of claim 7 or 8, wherein the magnifications of the upstream and downstream lens systems are automatically varied when the total magnification is varied.

12. The electron microscope of claim 7, wherein there is further provided an objective aperture having a diameter, and wherein the diameter of said objective aperture is modified according to the total magnification.

13. An electron microscope equipped with an energy filter and exhibiting a total magnification, said electron microscope comprising:
   an upstream lens system mounted upstream of said energy filter and exhibiting a magnification;
   a downstream lens system mounted downstream of said energy filter and exhibiting a magnification of more than 25 times the image formed by the upstream lens system; and
   an image-recording system made of a TV camera,
   wherein the magnifications of said upstream and downstream lens systems are both varied when the total magnification is varied.

14. The electron microscope of claim 13, wherein the ratio of the magnification of said upstream lens system to the total magnification is increased with increasing the total magnification.

15. The electron microscope of claim 13, wherein there is further provided an objective aperture having a diameter, and wherein the diameter of said objective aperture is modified according to the total magnification.

16. The electron microscope of claim 14, wherein there is further provided an objective aperture having a diameter, and wherein the diameter of said objective aperture is modified according to the total magnification.

17. The electron microscope of claim 15 or 16, wherein the magnifications of the upstream and downstream lens systems and the diameter of said objective aperture are automatically varied when the total magnification is varied.

18. The electron microscope of claim 13 or 14, wherein the magnifications of the upstream and downstream lens systems are automatically varied when the total magnification is varied.

* * * * *

UNITED STATES PATENT AND TRADEMARK OFFICE
CERTIFICATE OF CORRECTION

PATENT NO. : 6,323,485 B1
DATED : November 27, 2001
INVENTOR(S) : Katsushige Tsuno Page 1 of 1

It is certified that error appears in the above-identified patent and that said Letters Patent is hereby corrected as shown below:

Column 6,
Line 5, "[{$r_o$" should read -- [{($r_o$ --.

Column 9,
Line 23, "of claim 6" should read -- of claim 6 or 3 --.

Column 10,
Line 5, "of claim 9" should read -- of claim 12 or 9 --.

Signed and Sealed this

Thirtieth Day of April, 2002

Attest:

Attesting Officer

JAMES E. ROGAN
Director of the United States Patent and Trademark Office